(12) United States Patent  (10) Patent No.: US 7,199,448 B2
Janke et al.  (45) Date of Patent: Apr. 3, 2007

(54) INTEGRATED CIRCUIT CONFIGURATION COMPRISING A SHEET-LIKE SUBSTRATE

(75) Inventors: Marcus Janke, München (DE); Peter Laackmann, München (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/641,264

(22) Filed: Aug. 14, 2003

(65) Prior Publication Data

US 2004/0070052 A1 Apr. 15, 2004

Related U.S. Application Data

(63) Continuation of application No. PCT/DE02/00191, filed on Jan. 22, 2002.

(30) Foreign Application Priority Data

Feb. 14, 2001 (DE) ............... 101 06 836

(51) Int. Cl.
H01L 29/06 (2006.01)

(52) U.S. Cl. ............ 257/618; 257/617; 257/622; 257/623; 257/635; 257/668; 257/783; 257/254; 257/415; 257/420

(58) Field of Classification Search ............ 257/618, 257/617, 622, 623, 635, 668, 783
See application file for complete search history.

(56) References Cited

U.S. PATENT DOCUMENTS 4,021,097 A * 5/1977 McMahon ............ 385/44
5,783,845 A 7/1998 Kondo et al.
5,892,271 A * 4/1999 Takeda et al. ............ 257/668
5,955,776 A 9/1999 Ishikawa
6,027,958 A * 2/2000 Vu et al. ............ 438/110
6,392,143 B1* 5/2002 Koshio ............ 174/52.4
6,392,259 B1 5/2002 Allinger et al.
6,472,730 B1 10/2002 Yanagawa et al.
6,500,759 B1* 12/2002 Asakawa ............ 438/683
2001/0049155 A1 12/2001 Yamaji

FOREIGN PATENT DOCUMENTS

| EP | 0 981 162 A1 | 2/2000 |
|----|---|---|
| EP | 1 047 128 A2 | 10/2000 |
| JP | 58164231 A | 9/1983 |
| JP | 01244625 | 9/1989 |
| JP | 08007526 | 1/1996 |
| JP | 10199900 A | 7/1998 |
| JP | 11204566 A | 7/1999 |
| JP | 2000112825 | 4/2000 |
| JP | 2000-307050 | 11/2000 |
| JP | 2001284402 A | 10/2001 |

* cited by examiner

Primary Examiner—Evan Pert
Assistant Examiner—Tan Tran
(74) Attorney, Agent, or Firm—Laurence A. Greenberg; Werner H. Stemer; Ralph E. Locher

(57) ABSTRACT

An integrated circuit is formed on a non-planar substrate. The integrated circuit is formed over a plurality of layers. Chemical or physical changes in the microstructure of the substrate cause the bending of the substrate, in one or more propagation directions.

25 Claims, 2 Drawing Sheets

INTEGRATED CIRCUIT CONFIGURATION COMPRISING A SHEET-LIKE SUBSTRATE

CROSS-REFERENCE TO RELATED APPLICATION

This application is a continuation of copending International Application No. PCT/DE02/00191, filed Jan. 22, 2002, which designated the United States and which was not published in English.

BACKGROUND OF THE INVENTION

Field of the Invention

The invention relates to an integrated circuit configuration with a sheet-like substrate. An integrated circuit is formed on the sheet-like substrate, in a plurality of layers at least on one side. At least one surface of the substrate not planar in at least one propagation direction. The substrate is disposed on a carrier, which imparts a curvature on the substrate.

The development costs of integrated circuits situated on a semiconductor chip are nowadays so high that it is increasingly becoming of interest for competitors to analyze them in order to copy them. Moreover, some of today's attacks on semiconductor chips, which can jeopardize their security, are based on detailed knowledge of the internal construction of these modules. Therefore, for security reasons, too, attempts are made to prevent an attacker from learning details about the construction of such a semiconductor chip. Furthermore, in the meantime, applications in which the integrated circuits have data stored in resident fashion have become customary.

A multiplicity of methods have been disclosed heretofore for protecting such modules from analysis. By way of example, it is known to cover the surface of integrated circuits in such a way that they cannot readily be analyzed optically. European patent application EP 0981162 A1, for instance, describes such protection.

However, such protective measures can be circumvented by uncovering the covering by means of careful grinding-away, even if the surface protection is resistant to etching. By successively removing the layers and photographing the layer respectively uncovered, the construction of the integrated circuit can subsequently be analyzed in the case of configurations of this type.

U.S. Pat. No. 5,955,766 discloses forming an integrated circuit on a spherical substrate. However, that structure cannot be produced using conventional techniques.

SUMMARY OF THE INVENTION

It is accordingly an object of the invention to provide an integrated circuit configuration with a sheet-like substrate which overcomes the above-mentioned disadvantages of the heretofore-known devices and methods of this general type and which provides for an integrated circuit configuration that offers high security against analysis with a low outlay.

With the foregoing and other objects in view there is provided, in accordance with the invention, an integrated circuit configuration, comprising:

a sheet-like substrate having at least one non-planar surface in at least one propagation direction;

an integrated circuit formed on the substrate in a plurality of layers at least on one side of the substrate;

the substrate having a microstructure with chemical or physical changes causing mechanical stresses imparting a curvature defining the non-planar surface of the substrate.

By virtue of the fact that the substrate, at least in one propagation direction, is brought from the planar form to a non-planar form (i.e., it is bent), with a tenable outlay it cannot be processed by means of grinding methods in such a way that the surface can be completely removed in an analyzable manner layer by layer.

The lack of planarity (i.e., non-planarity) in a second direction increases the security specified above. The substrate is deformed by the application of a material, for example an adhesive or a curable ceramic, which generates a high mechanical stress.

The desired deformation can also be produced by mechanical stresses which arise in the substrate itself, for example through alteration of the chemical or physical microstructure of the substrate. By way of example, implantation methods, diffusion methods or thermal methods can be utilized for this purpose. Soldering and connecting methods, for instance between a plurality of substrates arranged one above the other, can likewise be used, given suitable technology, to generate mechanical stresses in the substrate in a targeted manner.

A deformed substrate generally maintains its deformed shape after a certain time. In order to prevent the substrate from being brought back to a flat, planar form by a pressure being exerted, it is also possible for partial regions to be removed at least on one surface.

By the provision of elevations on the carrier, a very complex, non-planar surface form of the integrated circuit configuration can be obtained using simple means.

Other features which are considered as characteristic for the invention are set forth in the appended claims.

Although the invention is illustrated and described herein as embodied in an integrated circuit configuration comprising a sheet-like substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
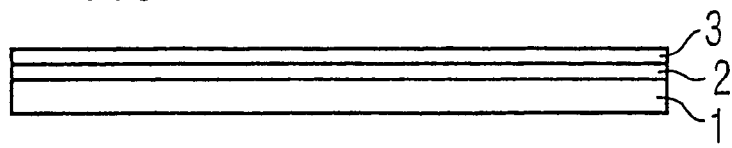
FIG. 1 is a diagrammatic side elevation showing a basic construction of an integrated circuit configuration on a semiconductor chip.

Referring now to the figures of the drawing in detail and first, particularly, to FIG. 1 thereof, there is shown a basic construction of an integrated circuit configuration. An integrated circuit is constructed in a known manner in a plurality of layers on a substrate 1. The layers are illustrated here as the layers 2 and 3 as minimum solution. At the present time, there are usually significantly more than two layers. Two layers form the minimum starting point for expedient applicability of the invention, since only then is a layer present which can be removed in order to analyze the underlying layer.

Figure 2:
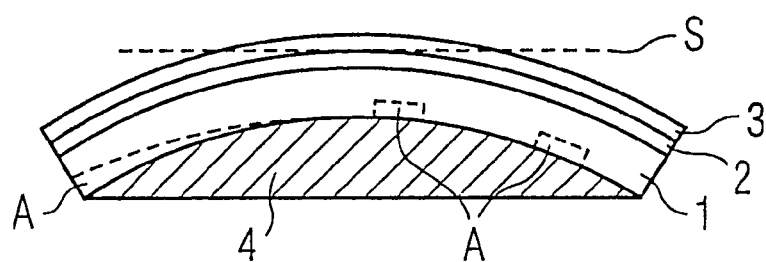
FIG. 2 is a side view of a first exemplary embodiment of an integrated circuit configuration according to the invention on a semiconductor chip.

The illustration in FIG. 2 shows that a material 4 is applied on the side remote from the layers 2 and 3, which material, upon curing, leads to stressing of the substrate 1, thereby forming a surface which is curved at least in one direction. Commercially available adhesives based on epoxy resin can be used for this purpose.

If this surface is removed by a grinding operation, for example at the level of the dashed line S, then only a small detail of the underlying layer is discernible. Should the remainder of the layer 3 also be removed, a large part of the layer 2 would likewise be concomitantly removed at the same time.

Figure 3:
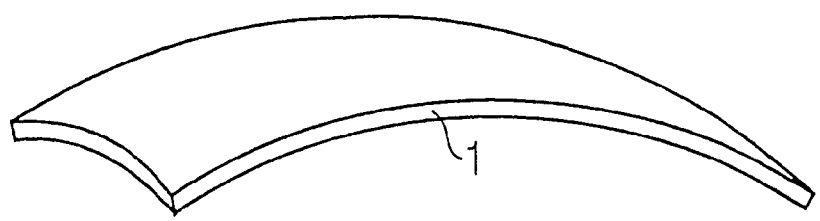
FIG. 3 is perspective view of the surface in the case of a modification of the first exemplary embodiment.
Figure 7:
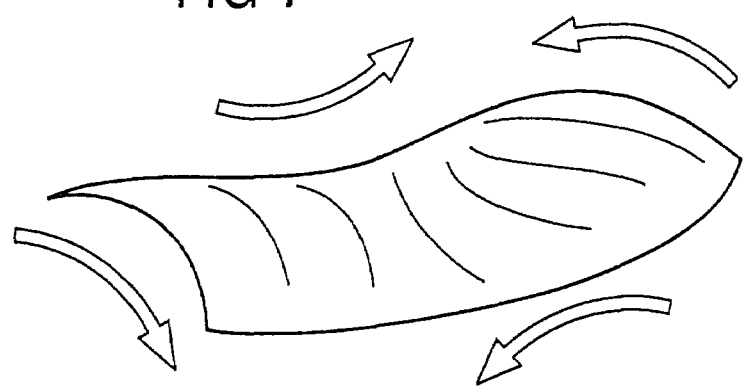
FIG. 7 is a perspective view of a possible surface configuration.

In addition to a curvature that is possible in one direction, a curvature in two directions is also possible, as illustrated in FIG. 3. With today's customary chip thicknesses of 185 μm, deformations of at least 1 μm can thus easily be achieved over the entire chip area. In this case, it should be noted that, if appropriate, the chip could be thinned to a greater extent in order to obtain a greater deformation. A torsional deformation, as illustrated in FIG. 7, is likewise conceivable. In this case, by way of example, diametrically opposed twisting of respective opposite sides is possible, as indicated by the arrows shown in FIG. 7.

In order, in the event of the material 4 being removed, to prevent the substrate 1 from being forced back into a planar form by means of pressure, parts A can be removed from the substrate surface, as is indicated by broken lines in FIG. 2. This is done either by obliquely etching away or grinding edge regions of the substrate, as is illustrated on the left-hand side of FIG. 2, or by etching out or grinding individual parts A, as is illustrated on the right-hand side of FIG. 2. This ensures that it is not possible, or at the very least it is a very complicated process, to bring the substrate 1 back to a planar form after a deformation.

Figure 4:
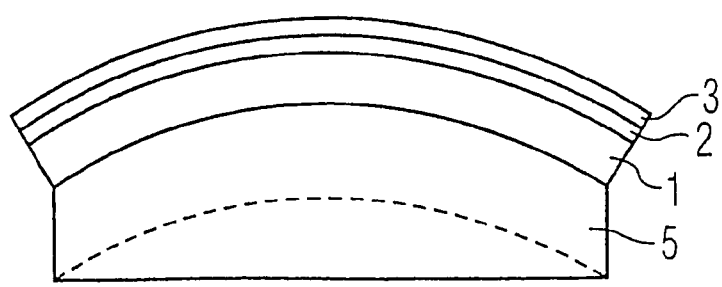
FIG. 4 is a side elevation of a second exemplary embodiment according to the invention.
Figure 5:
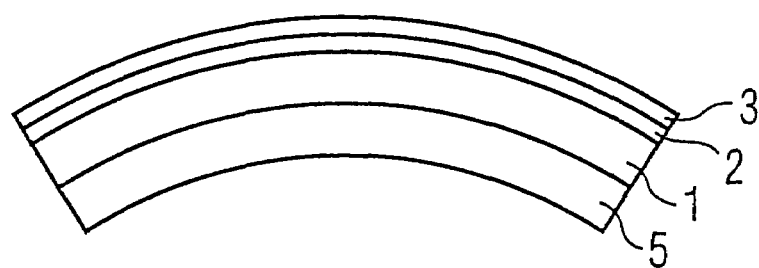
FIG. 5 is a side elevation of a modification of the second exemplary embodiment.
Figure 6:
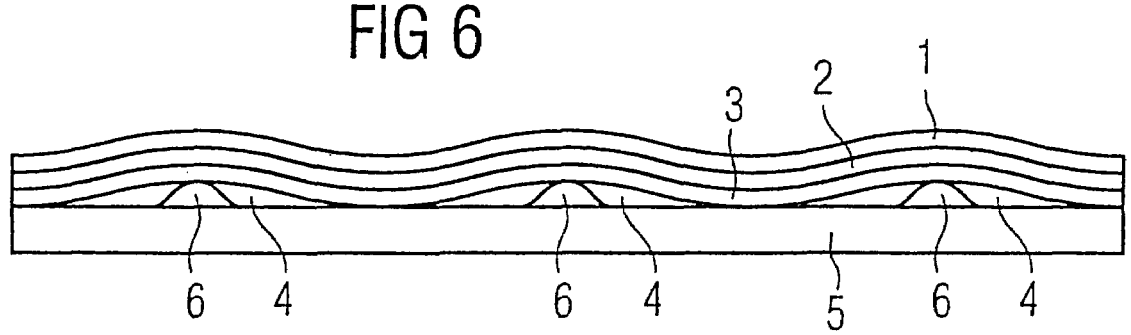
FIG. 6 is a side elevation of a second modification of the second exemplary embodiment.

In accordance with FIG. 4, the integrated circuit configuration is constructed in such a way that the substrate is applied on a carrier 5, the carrier 5 shaping the substrate. In this case, too, recesses could again be provided, which are not illustrated in connection with FIG. 4. In accordance with the configuration according to FIG. 5, unlike in accordance with FIG. 4, the carrier 5 is not only deformed on one surface but rather is likewise brought in its entirety from a planar form to a curved or else twisted form.

In a further exemplary embodiment according to the invention, elevations 6 are formed on the surface of the carrier 5 and, when brought together with the substrate 1, deform the substrate 1 together with its applied layers. This can be done in particular by a similar material 4, as in the exemplary embodiment illustrated in accordance with FIG. 2, being introduced into the interspaces between the elevations, the substrate and the carrier, which leads to the stressing of the substrate upon drying.

In summary, the basic idea of the invention is based on permanently deforming the substrate which carries an integrated circuit in such a way that it is not possible for the layers applied on the substrate to be selectively removed layer by layer by means of a grinding method.

In principle, it is also conceivable to directly fabricate a semiconductor chip with a surface that deviates in principle from planarity. On a chip surface of this type, the customary method steps for fabricating integrated circuits can only be used with great difficulty using the technologies that are available today, in order to fabricate integrated circuits with the desired complexity.

We claim:

1. An integrated circuit configuration, comprising:
  a sheet-like substrate having at least one non-planar surface in at least one propagation direction;
  an integrated circuit formed on said substrate, said integrated circuit being formed in a plurality of layers at least on one side of said substrate;
  an adhesive applied on said substrate, said substrate being permanently deformed by curing of said adhesive, thus imparting a permanent curvature defining the non-planar surface of said substrate.

2. The integrated circuit configuration according to claim 1, wherein said at least one non-planar surface is non-planar in two propagation directions, and said at least one non-planar surface has a curvature in two directions.

3. The integrated circuit configuration according to claim 1, wherein said substrate has partial regions removed from one surface thereof for forming voids therein.

4. The integrated circuit configuration according to claim 3, which comprises curable material in said voids, said curable material, upon curing, stressing said substrate.

5. The integrated circuit configuration according to claim 4, wherein the curable material is an epoxy resi-based adhesive.

6. The integrated circuit configuration according to claim 3, wherein said partial regions removed from one surface of said substrate are edge regions.

7. An integrated circuit configuration, comprising:
  a sheet-like substrate having at least one non-planar surface in at least one propagation direction; and
  an integrated circuit formed on said substrate, said integrated circuit being formed in a plurality of layers at least on one side of said substrate;
  said substrate being permanently deformed by stresses caused by implantation methods, thus imparting a permanent curvature defining the non-planar surface of said substrate.

8. The integrated circuit configuration according to claim 7, wherein said at least one non-planar surface is non-planar in two propagation directions, and said at least one non-planar surface has a curvature in two directions.

9. An integrated circuit configuration, comprising:
  a sheet-like substrate having at least one non-planar surface in at least one propagation direction; and
  an integrated circuit formed on said substrate, said integrated circuit being formed in a plurality of layers at least on one side of said substrate;
  said substrate being permanently deformed by stresses caused by diffusion methods, thus imparting a permanent curvature defining the non-planar surface of said substrate.

10. The integrated circuit configuration according to claim 9, wherein said at least one non-planar surface is non-planar in two propagation directions, and said at least one non-planar surface has a curvature in two directions.

11. An integrated circuit configuration, comprising:
- a sheet-like substrate having at least one non-planar surface in at least one propagation direction;
- an integrated circuit formed on said substrate, said integrated circuit being formed in a plurality of layers at least on one side of said substrate; and
- a carrier supporting said substrate and permanently imparting a given curvature to said substrate, said carrier being formed with at least one elevation on a surface thereof.

12. The integrated circuit configuration according to claim 11, wherein said at least one non-planar surface is non-planar in two propagation directions, and said at least one non-planar surface has a curvature in two directions.

13. The integrated circuit configuration according to claim 11, wherein said substrate has partial regions removed from one surface thereof for forming voids therein.

14. The integrated circuit configuration according to claim 13, which comprises curable material in said voids, said curable material, upon curing, stressing said substrate.

15. The integrated circuit configuration according to claim 14, wherein the curable material is an epoxy resin-based adhesive.

16. The integrated circuit configuration according to claim 13, wherein said partial regions removed from one surface of said substrate are edge regions.

17. The integrated circuit configuration according to claim 11, wherein said elevations, said substrate and said carrier define an interspace therebetween being filled with a curable material.

18. An integrated circuit configuration, comprising:
- a sheet-like substrate having at least one non-planar surface in at least one propagation direction;
- an integrated circuit formed on said substrate, said integrated circuit being formed in a plurality of layers at least on one side of said substrate; and
- a carrier supporting said substrate and permanently imparting a given curvature to said substrate.

19. The integrated circuit configuration according to claim 18, wherein said carrier is formed with a planar surface and a non-planar surface.

20. The integrated circuit configuration according to claim 18, wherein said carrier is formed with two non-planar surfaces.

21. The integrated circuit configuration according to claim 18, wherein said at least one non-planar surface is non-planar in two propagation directions, and said at least one non-planar surface has a curvature in two directions.

22. The integrated circuit configuration according to claim 18, wherein said substrate has partial regions removed from one surface thereof for forming voids therein.

23. The integrated circuit configuration according to claim 22, which comprises curable material in said voids, said curable material, upon curing, stressing said substrate.

24. The integrated circuit configuration according to claim 23, wherein said curable material is an epoxy resin-based adhesive.

25. The integrated circuit configuration according to claim 22, wherein said partial regions removed from one surface of said substrate are edge regions.

* * * * *